(12) United States Patent
Nale et al.

(10) Patent No.: US 11,688,452 B2
(45) Date of Patent: *Jun. 27, 2023

(54) REFRESH COMMAND CONTROL FOR HOST ASSIST OF ROW HAMMER MITIGATION

(71) Applicant: Intel Corporation, Santa Clara, CA (US)

(72) Inventors: Bill Nale, Livermore, CA (US); Christopher E. Cox, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/686,287

(22) Filed: Mar. 3, 2022

(65) Prior Publication Data

US 2022/0189532 A1 Jun. 16, 2022

Related U.S. Application Data

(60) Continuation of application No. 17/157,826, filed on Jan. 25, 2021, now Pat. No. 11,282,561, which is a (Continued)

(51) Int. Cl.
*G11C 11/406* (2006.01)
*G11C 11/4096* (2006.01)
*G06F 3/06* (2006.01)

(52) U.S. Cl.
CPC ...... *G11C 11/40611* (2013.01); *G06F 3/0619* (2013.01); *G06F 3/0659* (2013.01);
(Continued)

(58) Field of Classification Search
CPC .................................................. G11C 11/40611
(Continued)

(56) References Cited

U.S. PATENT DOCUMENTS

| 11,282,561 B2 * | 3/2022 | Nale ...................... G06F 3/0619 |
| 2014/0219043 A1 | 8/2014 | Jones et al. |

(Continued)

OTHER PUBLICATIONS

First Office Action for U.S. Appl. No. 16/370,578, dated May 14, 2020, 10 pages.
(Continued)

*Primary Examiner* — Muna A Techane
(74) *Attorney, Agent, or Firm* — Compass IP Law PC

(57) ABSTRACT

A memory device with internal row hammer mitigation couples to a memory controller. The memory controller or host can assist with row hammer mitigation by sending additional refresh cycles or refresh commands. In response to an extra refresh command the memory device can perform refresh for row hammer mitigation instead of refresh for standard data integrity. The memory controller can keep track of the number of activate commands sent to the memory device, and in response to a threshold number of activate commands, the memory controller sends the additional refresh command. With the extra refresh command the memory device can refresh the potential victim rows of a potential aggressor row, instead of simply refreshing a row that has not been accessed for a period of time.

20 Claims, 8 Drawing Sheets

Related U.S. Application Data division of application No. 16/370,578, filed on Mar. 29, 2019, now Pat. No. 10,950,288.

(52) U.S. Cl.
CPC ........ *G06F 3/0673* (2013.01); *G11C 11/4096* (2013.01); *G11C 11/40618* (2013.01)

(58) Field of Classification Search
USPC .......................................................... 365/149
See application file for complete search history.

(56) References Cited

U.S. PATENT DOCUMENTS

| | | |
|---|---|---|
| 2015/0279441 A1 | 10/2015 | Greenberg et al. |
| 2016/0211008 A1 | 7/2016 | Benedict et al. |
| 2016/0225434 A1 | 8/2016 | Halbert et al. |
| 2017/0110178 A1 | 4/2017 | Bains |
| 2017/0213586 A1* | 7/2017 | Kang ................... G06F 3/0659 |
| 2018/0114561 A1 | 4/2018 | Fisch et al. |
| 2018/0158507 A1* | 6/2018 | Bang ................. G11C 11/40611 |
| 2018/0174639 A1 | 6/2018 | Bains et al. |
| 2018/0218767 A1 | 8/2018 | Wolff |
| 2018/0342282 A1 | 11/2018 | Morgan |
| 2019/0066759 A1 | 2/2019 | Nale |
| 2019/0066808 A1 | 2/2019 | Nale |
| 2019/0073161 A1 | 3/2019 | Nale |
| 2019/0096472 A1 | 3/2019 | Kang et al. |
| 2019/0198090 A1 | 6/2019 | Lee |
| 2019/0228810 A1 | 7/2019 | Jones et al. |
| 2019/0347019 A1 | 11/2019 | Shin et al. |
| 2019/0362774 A1* | 11/2019 | Kuramori ........... G11C 11/4087 |
| 2020/0135263 A1 | 4/2020 | Brown et al. |

OTHER PUBLICATIONS

Notice of Allowance for U.S. Appl. No. 17/157,826, dated Nov. 10, 2021, 10 pages.

Notice of Allowance for U.S. Appl. No. 16/370,578, dated Oct. 28, 2020, 9 pages.

Notice of Allowance for U.S. Appl. No. 17/157,826, dated Aug. 5, 2021, 10 pages.

Restriction Requirement for U.S. Appl. No. 16/370,578, dated Apr. 30, 2020, 6 pages.

* cited by examiner

COMMAND TABLE 500

| FUNCTION | ABBR | CS | CA PINS | | | | | | | | | | | | | |
|---|---|---|---|---|---|---|---|---|---|---|---|---|---|---|---|---|
| | | | CA0 | CA1 | CA2 | CA3 | CA4 | CA5 | CA6 | CA7 | CA8 | CA9 | CA10 | CA11 | CA12 | CA13 |
| ACTIVATE | ACT | L | L | L | R0 | R1 | R2 | R3 | BA0 | BA1 | BG0 | BG1 | BG2 | CID0 | CID1 | CID2 |
| | | H | H | R4 | R5 | R6 | R7 | R8 | R9 | R10 | R11 | R12 | R13 | R14 | R15 | R16 | CID3/R17 |
| REFRESH ALL | REF | L | H | H | L | L | H | CID3 | V | V | V | V | L | CID0 | CID1 | CID2 |
| REFRESH SAME BANK | REFsb | L | H | H | L | L | H | CID3 | BA0 | BA1 | V | V | H | CID0 | CID1 | CID2 |
| SELF REFRESH ENTRY | SRE | L | H | H | H | L | H | V | V | V | V | V | L | V | V | V |

510

REFRESH COMMAND CONTROL FOR HOST ASSIST OF ROW HAMMER MITIGATION

PRIORITY

This application is a Continuation of U.S. patent application Ser. No. 17/157,826, filed Jan. 25, 2021, now U.S. Pat. No. TBD, which in turn is a Divisional of U.S. patent application Ser. No. 16/370,578, filed Mar. 29, 2019, now U.S. Pat. No. 10,950,288. The present application claims the benefit of priority of these applications.

FILED

Descriptions are generally related to computer memory systems, and more particular descriptions are related to mitigation of row hammer events.

BACKGROUND

As computer devices continue to decrease in size and increase in capacity and capability, the minimum device geometries used to manufacture the components continues to decrease. The decreases in memory device geometries enables continued system scaling, but it creates the potential for data loss due to row hammer or row disturb events. "Row hammer" refers to a failure caused by repeated access to a target row or aggressor row within a time period. Repeated activation for access to the aggressor row can cause failure in a victim row that is adjacent or proximate to the target/aggressor row, where repeated activation of the target row causes migration of charge across the passgate of the victim row, resulting in a nondeterministic state of the victim row. Row hammer is a known issue in DRAM (dynamic random access memory) devices.

With the decreasing device geometries, the number of activates to a specific row that could cause a row hammer event has gone from 500K to 300K, and is now projected to be at 100K and even decrease to a range of about 30K-50K activates. With row hammer events caused by fewer activates, more rows could be aggressors within the refresh window, and more row hammer mitigation becomes needed to reduce the risk of data loss.

Traditional row hammer mitigation managed by the memory controller places a significant burden on the memory controller, and coordination of management between the memory controller and the DRAM places a burden on the memory bus bandwidth. Most DRAM devices now handle row hammer mitigation internally, typically by "stealing" refresh cycles to perform row hammer refreshing. Thus, the DRAM device itself determines how many refresh cycles issued by the memory controller will be used for row hammer mitigation.

However, as the row hammer threshold lowers, the memory device will need to steal more refreshes than can reasonably be taken without compromising data integrity in the device. One option is to increase the refresh rate. However, increasing the refresh rate would place a constant requirement on the memory subsystem for power and bandwidth, even when row hammer refreshing is not needed. Thus, changing the refresh rate would be inefficient because of the risk of over-refreshing when row hammer conditions are not present.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
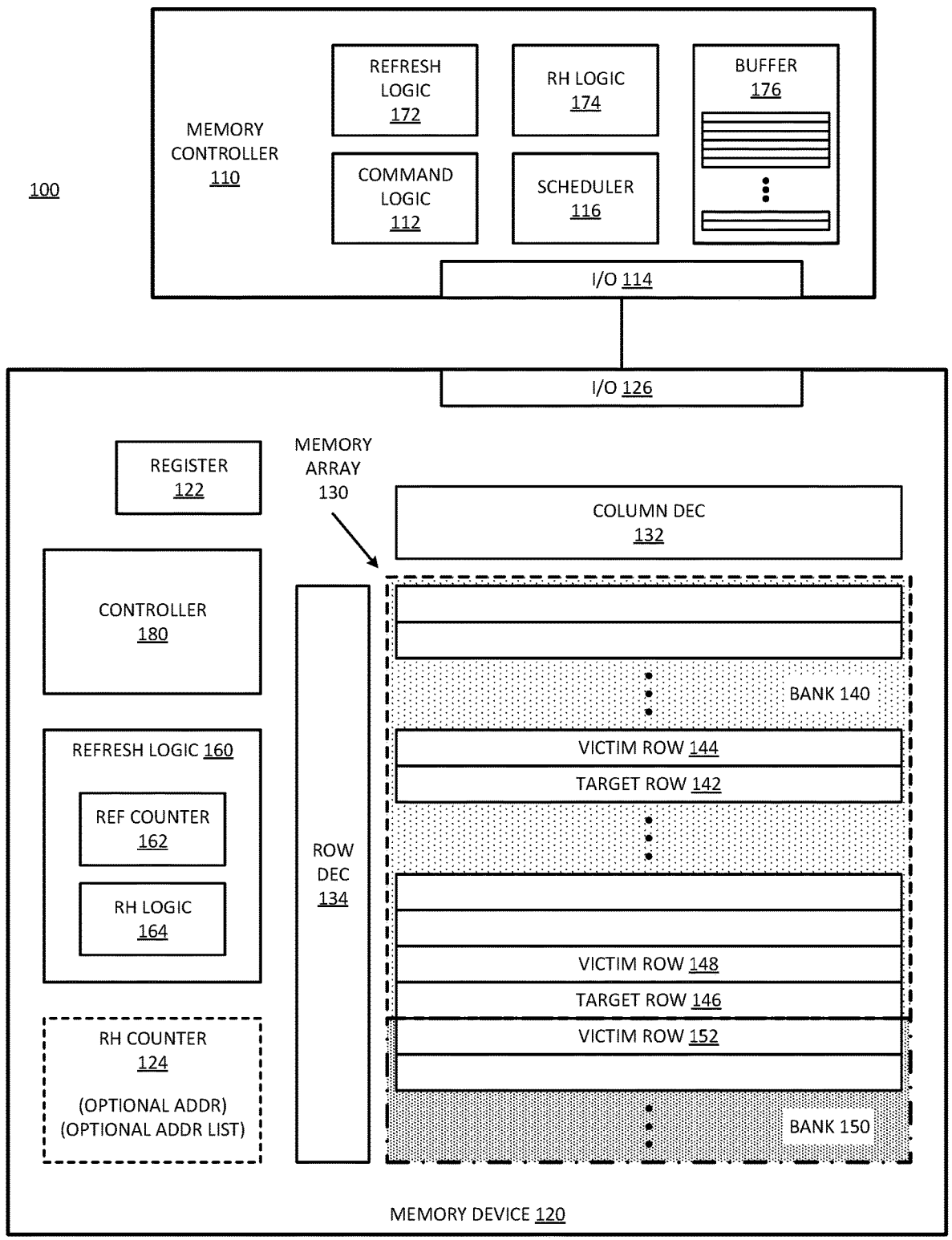
FIG. 1 is a block diagram of an embodiment of a system that performs row hammer mitigation with host assist.

Descriptions of certain details and implementations follow, including non-limiting descriptions of the figures, which may depict some or all examples, and well as other potential implementations.

DETAILED DESCRIPTION

As described herein, row hammer mitigation is host assisted and memory device managed. A memory device performs internal row hammer mitigation, and the memory controller or host can assist with row hammer mitigation by sending additional refresh cycles or refresh commands. The system can track the need for sending additional refresh cycles to prevent the use of power and bandwidth for unnecessary refreshing.

For example, the memory controller can keep track of the number of activate commands sent to the memory device, and in response to a threshold number of activate commands, the memory controller sends the additional refresh command. In response to an extra refresh command, the memory device can perform refresh for row hammer mitigation instead of refresh for standard data integrity. With the extra refresh command, the memory device can refresh the potential victim rows of a potential aggressor row, instead of simply refreshing a row that has not been accessed for a period of time. In such an implementation, the memory device will have sufficient refresh cycles available to perform row hammer mitigation, but the excess cycles can still be effectively on demand instead of simply increasing the refresh rate. The extra refresh commands can be referred to as excess refresh commands. In one example, the extra refresh commands can be issued as refresh management (RFM) commands from the host designed to address row hammer issues.

The host controller or memory controller sends additional refresh commands to memory devices, for example, dynamic random access memory (DRAM) devices, to compensate for the extra refreshes needed for row hammer mitigation. Providing additional refresh cycles can enable the memory device to steal cycles without compromising data integrity by still providing enough refresh cycles for standard refresh operation. In one example, the memory controller determines the number of extra refresh commands to send by how many activate commands have been sent to the memory device. There is a high correlation between the number of activates sent to the memory device and the number of refreshes the memory device needs to steal to perform row hammer mitigation.

Host assisted row hammer mitigation as provided can obviate the need for target row refresh (TRR) protocols in the host controller. TRR occurs when the controller becomes aware of a potential row hammer event by its own monitoring or by signaling from the memory device. With TRR, the controller can send a specific refresh command indicating the target row, and the memory device will refresh the victim row or victim rows. Host assisted row hammer mitigation does not require the controller to know the target row for a TRR command. Additionally, host assisted row hammer mitigation can simply approximate the need for row hammer mitigation by watching the number of activates generally, without concern of whether a particular target row is the subject of a threshold number of activates.

The host assisted row hammer mitigation leaves the decision making of what rows to refresh in the control of the memory device. There tends to be quite a bit of margin in the internal operation of refresh, and memory device manufacturers know the specific capabilities and needs for their own devices, rather than operating simply on worst case scenarios. Such a capability allows the memory device to perform row hammer mitigation and refresh control in a device-specific or manufacturer-specific manner. Thus, for example, DRAM manufacturers know how many refreshes they can safely steal without affecting data integrity, and can perform whatever mitigation makes sense for their specific devices.

FIG. 1 is a block diagram of an embodiment of a system that performs row hammer mitigation with host assist. System 100 includes memory device 120 coupled to memory controller 110, which could also be referred to as a host controller, or simply, a controller. Memory device 120 can include any type of memory technology that has adjacent rows of memory cells, where data is accessible via a wordline or the equivalent. In one example, memory device 120 includes DRAM technology. The rows of memory device 120 need to be refreshed to maintain deterministic state.

Memory device 120 includes memory array 130, which represents an array of memory cells or storage cells. A memory cell stores a bit of data, or multiple bits for a multilevel cell. Memory array 130 includes a representation of potential row hammer situations. For purposes of example, memory array 130 shows bank 140 and bank 150. It will be understood that memory array 130 can include multiple banks. In general, a bank or a sub-bank of memory includes memory cells that are addressable separately from memory cells of another bank or sub-bank, and are thus accessible in parallel to another portion of memory array 130. Memory array 130 can include portions not illustrated in system 100.

Memory device 120 includes column decoder (dec) 132 which represents circuitry to apply charge to a column based on an access command. In one example, the circuitry selects a column in response to a column address strobe (CAS) command. Memory device 120 includes row decoder (dec) 134 which represents circuitry to apply selection voltages to rows based on a memory access command. In one example, the circuitry selects a column in response to a row address strobe (RAS) command.

Memory controller 110 includes command logic 112 to generate commands for memory device 120. Commands can include commands such as Write commands or Read commands. Commands can also include Activate commands, Precharge commands, Refresh commands, or other commands. In one example, memory controller 110 includes refresh logic 172, which represents logic to control the refreshing of memory device 120. Refresh logic 172 can include one or more counters to determine the need for refresh of memory device 120 and register space to track the sending of refresh commands. Refresh commands can include external refresh commands (e.g., REF, REFpb) where the memory device continues to operate in accordance with a clock signal from memory controller 110. Refresh commands can include a self refresh command (e.g., SRE) where the memory device operates on an internal clock instead of based on a clock signal from the memory controller. An external refresh has a specific window for completion of the command, and self refresh is a state the memory device can be in for a non-specific amount of time.

Memory controller 110 includes scheduler 116 to manage the scheduling and sending of sequences of commands to memory device 120. Scheduler 116 includes logic to determine the order of commands, as well as timing requirements for the commands. Memory controller 110 has to make determinations of what commands to send. It will also make determinations of the order of commands to ensure compliance with timing requirements. Scheduler 116 can enable memory controller 110 to make certain determinations regarding commands and timing. In one example, scheduler 116 determines how many external refresh commands to send during a refresh window. Scheduler 116 can generate an extra refresh command to enable row hammer mitigation.

In one example, memory controller 110 includes row hammer (RH) logic 174 to enable the controller to determine when a threshold number of activate commands or activates have been sent to memory device 120. For example, row hammer logic 174 can include one or more counters or other logic to monitor potential row hammer conditions. In one example, row hammer logic 174 includes a comparator to determine when an activate counter has reached a threshold number. In one example, the threshold number is programmable, such as by mode register or other register or configuration, such as in register 122. Memory controller 110 can read the configuration and store it in a register or other device internally to memory controller 110 (not specifically shown).

Memory controller 110 includes I/O (input/output) hardware 114. I/O 114 represents transceivers and signal line interface hardware to enable memory controller 110 to connect to memory device 120 over one or more buses. I/O 114 enables memory controller 110 to send commands to memory device 120. Memory controller 110 includes buffer 176, which buffers a sequence of commands to send to memory devices 120. In one example, buffer 176 is part of scheduler 116. Scheduler 116 determines the commands and the order of commands to send, which can then be queued up in buffer 176 for transmission via I/O 114.

For an illustration of a row hammer condition, memory array 130 includes target row 142 in bank 140. A physically proximate row or a physically adjacent row can suffer from unintentional programming or disturb of one or more values stored in the row based on repeated access to target row 142 within a time period prior to a refresh operation on the row. Victim row 144 represents a row that is subject to row hammer when target row 142 is repeatedly accessed. When victim row 144 is at risk of a row hammer event, target row 142 can be referred to as an aggressor row. There may be another row in bank 140 that is a victim row to target row 142.

In one example, bank 140 also includes target row 146. Consider that target row 146 is at or near a bank boundary. It will be understood that the rows in memory array 130 may have a spacing that is not different even if the rows are in different banks. Rather, the separation of one bank to another can be defined by selection or decode hardware elements. Thus, depending on the architecture of the physical layout of the rows, a row on the boundary of bank 150 could also be at risk for a row hammer event based on access to target row 146. In one example, repeated access to a target row can cause a disturb of multiple adjacent rows. In as illustrated, target row 146 can result in row hammer events to both victim row 148 of bank 140 and victim row 152 of bank 150.

Memory device 120 includes I/O 126 to interface with I/O 114 of memory controller 110. I/O 126 has corresponding signal lines to I/O 114 to receive commands and address information to receive activate and refresh commands, among other commands. In one example, I/O 126 includes an interface to a data bus to exchange data with memory controller 110.

Memory device 120 includes register 122, which represents one or more registers or storage locations to store configuration information or values related to the operation of memory device 120. In one example, register 122 includes one or more mode registers. In one example, register 122 includes configuration information to control the application of refresh internally to memory device 120. In one example, register 122 includes information related to row hammer operation, such as a threshold number of activates prior to a row hammer condition.

Memory device 120 includes controller 180, which represents a controller local to the memory device. Controller 180 includes hardware logic to execute operations in response to commands. Controller 180 includes software or firmware logic to control the hardware logic and control operations and sequences of operations in the memory device. In one example, controller 180 includes refresh logic 160. In one example, controller 180 includes RH counter 124. Controller 180 manages I/O 126.

In one example, memory device 120 includes refresh logic 160, which represents logic within memory device 120 to manage refreshing of memory array 130. In one example, refresh logic 160 includes refresh (ref) counter 162 and row hammer (RH) logic 164. Refresh counter 162 can indicate an address of a row to be refreshed. Refresh counter 162 can represent multiple counters, as different banks or sub-banks may have different addresses identified for refresh. Row hammer logic 164 enables memory device 120 to manage row hammer mitigation. Row hammer logic 164 can include one or more counters, lists or potential aggressor rows, or other logic to perform row hammer mitigation. In one example, row hammer mitigation occurs by performing refresh of the potential victim rows of the last row address to receive an activate command. The heuristic involved in such an approach recognizes that when a row is being hammered, it is most likely to be the row whose address just received an activate command prior to receiving a refresh command to use for row hammer mitigation. On average, such an approach should refresh potential victim rows if enough row hammer mitigation operations are performed.

In one example, memory device 120 includes one or more row hammer (RH) counters 124. Counter 124 can be or include row hammer detection logic. In one example, memory device 120 detects potential row hammer conditions and performs operations to mitigate the risk associated with a row hammer event. In one example, counter 124 keeps a count associated with one or more rows that are being accessed repeatedly. For example, counter 124 can keep an optional address (addr) list of rows with highest activation counts within a refresh window. The counts could be reset after a refresh.

It will be understood that to keep track of the number of activates per row would be impractical, as 1 million counters or more would be required per bank in certain memory devices. Memory devices typically employ heuristics or perform based on probabilities to apply row hammer mitigation. Instead of tracking the activates for all rows, only selected rows could be tracked. When a counter reaches a threshold number refresh logic 160 can perform a row hammer refresh. In such an implementation, the lowest count could be replaced each time a new row is activated. In one example, counter 124 keeps the list of the rows with the highest number of activates, and performs a row hammer mitigation for the row or rows with the highest number of activates when an external refresh command is received. As such, refresh logic 160 does not necessarily wait until reaching a threshold number before performing a row hammer refresh mitigation.

Another heuristic technique is to randomly assign a row hammer refresh for a randomly selected row that has received an activate. Such an implementation may only need counter 124 to optionally store the address of the recently activated row. In theory a row that is repeatedly activated will have a higher likelihood of being randomly selected for row hammer mitigation refresh. Thus, probabilistically the rows being hammered or accessed repeatedly are also the rows more likely to be selected for row hammer mitigation. The logic and circuitry requirements of such an approach are simpler than what is required for keeping a list of rows, but is less precise in row hammer mitigation.

Refresh logic 160 represents logic within memory device 120 to control refresh of rows within memory array 130. Refresh logic 160 responds to external refresh commands sent by refresh logic 172 of memory controller 110. Refresh logic 160 controls the operation of refresh during self refresh operation of memory device 120. Refresh logic 160 includes refresh (ref) counter 162 to track row addresses for scheduled refresh operations. Scheduled refresh operations include refresh of sequential rows to ensure all rows are refreshed within the refresh period. Refresh logic 160 of memory controller 110 is responsible to ensure that sufficient refresh operations are scheduled for memory device 120 to meet refresh requirements.

In one example, refresh logic 172 will schedule more refresh operations than necessary in a refresh period. As described, row hammer logic 174 can provide extra or excess refreshes for refresh logic 160 to use for row hammer mitigation, based on the number of activates sent to memory device 120. It will be understood that with additional row hammer mitigation refreshes provided by memory controller 110, even heuristic approaches will significantly reduce the likelihood of data loss due to row hammering.

In one example, refresh logic 160 includes row hammer logic 164 to provide refresh operations for row hammer mitigation. Row hammer mitigation refers to refresh of potential victim rows to avoid row disturb. In operation, counter 124 can indicate a target row to row hammer logic 164, which can trigger "refresh stealing" by refresh logic 160. Refresh stealing refers to refresh logic 160 performing refresh of victim rows associated with the indicated target row instead of performing a refresh of a row indicated in refresh counter 162. Thus, row hammer mitigation refresh operations are out of order with respect to the refresh row pointer or counter. Row hammer mitigation can include stealing all refreshes of an entire refresh operation or a refresh cycle, or simply one or more refreshes of a refresh operation. For a command that is either tagged or indicated as a row hammer refresh (described in more detail below), or when refresh logic 160 determines that a refresh command corresponds in time with an activate threshold being reached, the logic can determine it is safe to use all cycles for row hammer mitigation.

In response to an external refresh command memory device 120 typically performs refresh of multiple rows. The refresh operation refers to the refresh of all the rows to be refreshed in response to a single refresh command. The refresh operation has a time tRFC (row refresh cycle time), and there will be an average refresh interval of tREFI (refresh interval time) between refresh operations in the refresh period or refresh window. The refresh period refers to a time between refreshes of any given row to avoid loss of data in the row. A refresh can refer to the refresh of a single row of all the rows to be refreshed in response to the refresh command, and has a time less than tRFC since a single refresh operation includes multiple refreshes.

It will be understood that there can be multiple target rows in the same bank, such as what is illustrated in bank 140. As the critical number for row hammer decreases, because the number of activates required to cause a row disturb continues to decrease, the number of potential aggressor rows will increase. Thus, the number of row hammer mitigation operations needed per refresh period continues to increase. To permit more row hammer mitigation operations, memory controller 110 sends more external refresh commands, based specifically on determining how many activate commands have been sent. Refresh (whether external or internal) is the only time the memory controller and memory device can ensure that there will be no access to a row. It will be understood that different banks can be refreshed at different times, and thus be unavailable for access at different times. Banks not being refreshed can be accessed, and thus, scheduler 116 will manage the scheduling of refreshes of different banks.

Row hammer logic 174 of memory controller 110 can keep track of the number of activate commands send to memory device 120 to trigger the sending of additional refresh commands. Such a mechanism is much simpler than having memory device 120 keep track of the need for additional refreshes and trying to signal the memory controller. When row hammer logic 174 keeps track of the thresholds for sending excess refreshes, the operation can be performed based on configurable parameters, such as the activate threshold. Such an approach enables configurability for different operating conditions, for different devices or manufacturers, or other variables that can affect the need for additional row hammer mitigation.

The operation of row hammer logic 174 can vary for different implementations. In one example, row hammer logic 174 sends an additional refresh command each time a programmable threshold has been reached, regardless of the time window. In one example, row hammer logic 174 send an additional refresh only when the count has been reached within a certain time segment. For example, the count may be reset for each normal refresh period, and the count will only trigger an additional external refresh if the threshold is reached within the refresh window.

In one example, the period of interest for sending the additional refresh command is a sliding window. A sliding window can be set up, for example, by use of a leaky bucket approach. In a leaky bucket approach, row hammer logic 174 can decrement (or increment, depending on the approach) a count in response to each activate command. In a decrement approach, reaching zero on the count can trigger the sending of an additional refresh. In one example, row hammer logic 174 will decrement on a time basis to result in a nominal rate of activates per μs (microsecond) that will not cause any additional refresh cycles. In such an approach only detection of cycles above the nominal rate will cause the row hammer logic 174 to send extra refreshes. Such an approach can be based on an assumption that only a rate of activates over a specific time will trigger a row hammer event rather than just total activates.

In a counter up approach, the refresh can occur on a sub-refresh period, which can be, for example, ¼ or ½ of the normal refresh time. Thus, each fixed period row hammer logic 174 can trigger the sending of an extra refresh command. Consider an example of 100,000 causing a row disturb, row hammer logic 174 can trigger the sending of an additional refresh command after 80 k activates, or 60 k activates, or some other programmable count lower than the row disturb value.

The timing of sending extra refreshes can be adjusted in any of a number of different ways. In one example, the frequency of extra refreshes is adjusted by programmability or configuration. In one example, the frequency of extra refreshes depends on the way in which extra refresh monitoring is performed. The frequency can be adjusted by a combination of method of monitoring as well as programmability. As described above, the method of monitoring depends on whether an extra refresh is sent in response to detection of a threshold number of activates regardless of time window, or a number of activates within a fixed time window, or a number of activates within a sliding window. In one example, the time period is programmable rather than fixed at the refresh period. In one example, the sliding window is programmable. In one example of a leaky bucket approach, the rate at which the leaky bucket fills is programmable.

The granularity of row hammer mitigation tracking can be dependent on the implementation. The granularity of tracking is described in more detail below. In general, the granularity depends on the level at which monitoring is performed. In one example, the monitoring is performed at the device level. In one example, the monitoring is performed at the channel level. In one example, the monitoring is performed at the rank. In one example, the monitoring is performed at the bank group. In one example, the monitoring is performed at the bank.

Figure 2:
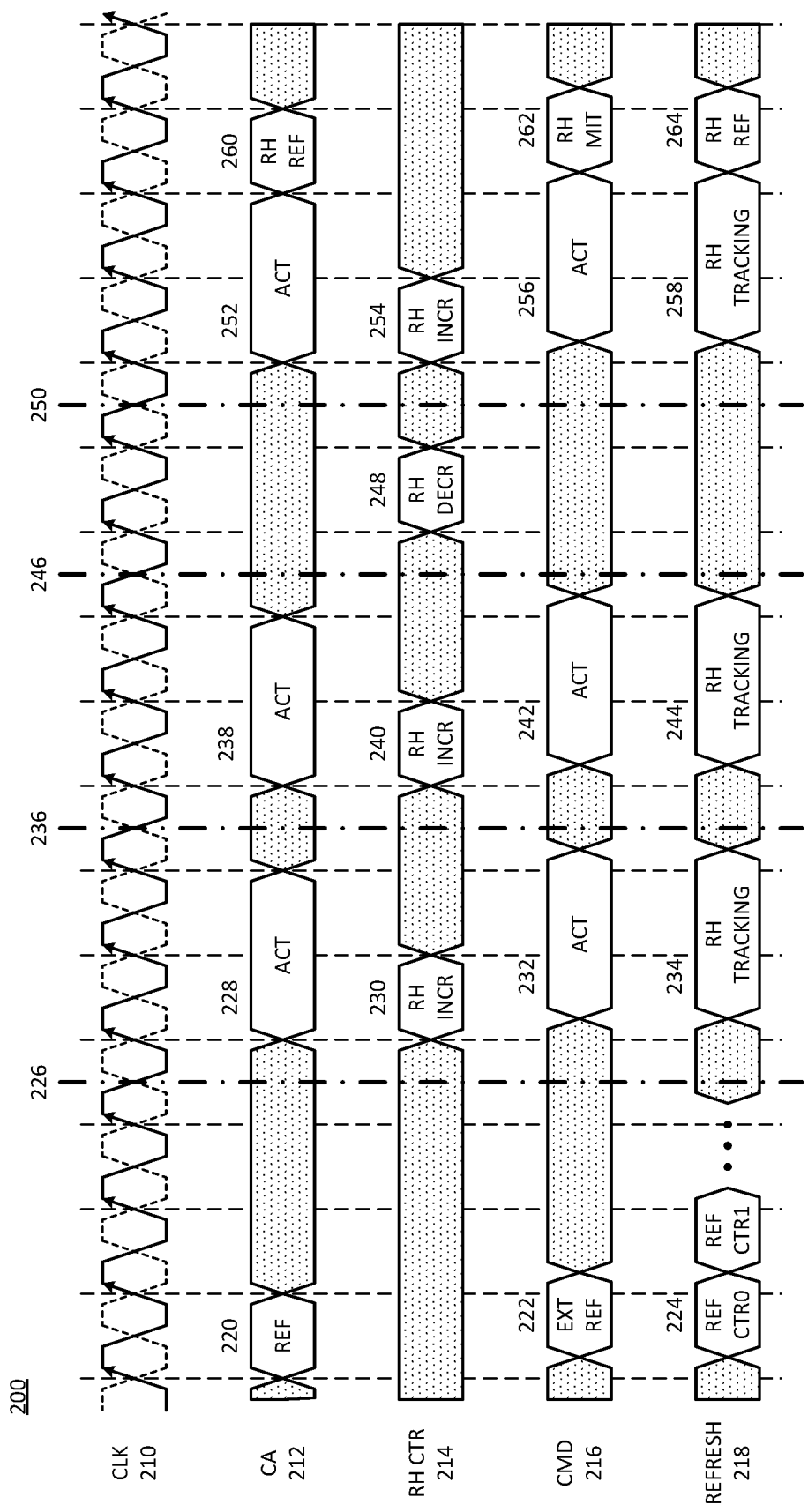
FIG. 2 is a timing diagram of an example of command sequencing for excess external refreshes for row hammer mitigation refresh.

FIG. 2 is a timing diagram of an example of command sequencing for excess external refreshes for row hammer mitigation refresh. Diagram 200 represents a timing diagram for refresh with row hammer mitigation. Diagram 200 represents multiple interconnections between a host or memory controller and associated memory devices, as well as certain internal functions within the memory device. The interconnection is provided through one or more signal lines.

CLK 210 represents a clock for the system, and both the clock (CK_t) and the complement (CK_c) are illustrated. For the example of diagram 200, the clock is the solid line signal with the arrows to indicate a rising edge. The complement is illustrated as a dashed line. CA 212 represents a command/address (C/A) signal sent on C/A signal lines, and indicates a command encoding as provided by the host. CMD 216 represents a decoding of the command encoding, and can thus represent a signal internal to the memory device for operations generated to carry out the command. RH CTR 214 represents a row hammer counter for the memory controller. Refresh 218 represents the operation of refresh within the memory device.

CA 212 illustrates a REF command at 220. The refresh command represents a standard external refresh command from the memory controller. At 222, the memory device interprets the command as an external (EXT) refresh command on CMD 216, and generates internal operations at 224 to implement the refresh. Refresh 218 illustrates a sequence of refresh commands, which can include REF of CTR0, followed by CTR1, and so forth until the rows are refreshed corresponding to the external refresh command. CTR0 and CTR1 represents a value to indicate which row to refresh, which can be a counter or pointer to track internal refresh operations. In one example, not specifically illustrated, the memory device will steal one or more refresh cycles to perform row hammer mitigation refreshing.

Dashed line 226 represents a time break. CA 212 illustrates an ACT command at 228. In one example, the ACT command is followed by row hammer counter 214 performing a row hammer increment (RH INCR) at 230. The increment represents the tracking of the activate command by the memory controller, although it will be understood that the increment could alternatively be a decrement, depending on the implementation of the row hammer mitigation tracking. The activate command is also followed on CMD 216 by one or more internal operations to execute the activate command at 232. In one example, the memory device also tracks the row hammer implications of the activate command on refresh 218 at 234. It will be understood that the row hammer tracking is in addition to executing the activate command on the row indicated by an address accompanying the activate command. In a system that keeps track of multiple counters for row hammer mitigation, the row hammer tracking can include updating counter information.

Dashed line 236 represents a time break. CA 212 illustrates a subsequent ACT command at 238. It will be observed that the subsequent activate command can trigger the same operations as illustrated by RH INCR on row hammer counter 214 at 240, ACT on CMD 216 at 242, and RH tracking on refresh 218 at 244. It will be understood from this section that when the activate commands are received, the memory controller can track them, but may not trigger row hammer mitigation unless a threshold has been reached.

Dashed line 246 represents a time break. After the time break, whatever may be happening on CA 212, in one example a time threshold is reached in a system that performs a leaky bucket approach to row hammer detection. In response to the time being reached, in one example, the memory controller performs a row hammer decrement (RH DECR) on row hammer counter 214 at 248.

Dashed line 250 represents a time break. CA 212 illustrates a subsequent ACT command at 252. It will be observed that the subsequent activate command triggers the threshold for row hammer mitigation. Thus, when RH INCR happens on row hammer counter 254 at 254, the memory controller determines to trigger an extra refresh command. In response to ACT on CA 212, the memory device decodes the activate operations as illustrated on CMD 216 at 256 and RH tracking on refresh 218 at 258 performs internal row hammer tracking. In response to the threshold activate command, at some point after the activate command, on CA 212 the memory controller sends a row hammer refresh command (RH REF) at 260. While illustrated adjacent to the ACT command that triggered the row hammer condition, the refresh command may or may not be sent directly adjacent the ACT command. In one example, the REF command is sent adjacent the ACT command, for example, by logic in the memory controller detecting the condition, scheduling the REF command, and buffering it for sending to the memory device.

In the case where the activate command triggers a row hammer mitigation, CMD 216 illustrates a row hammer mitigation (RH MIT) selection by the memory device at 262. Row hammer mitigation selection can include the memory device selecting victim rows for refresh. In response to selection of the victim row or rows, the memory device can perform a row hammer mitigation refresh represented by RH REF on refresh 218 at 264. Refresh is the only time the memory device will be assured that the host will not try to access the memory device, which permits the memory device to perform refresh on the row hammer victim instead of in accordance with a refresh counter. Thus, row hammer mitigation refresh performed during a refresh cycle provides operations guaranteed to be free of other operation by the memory device or attempted access by the memory controller.

Figure 3:
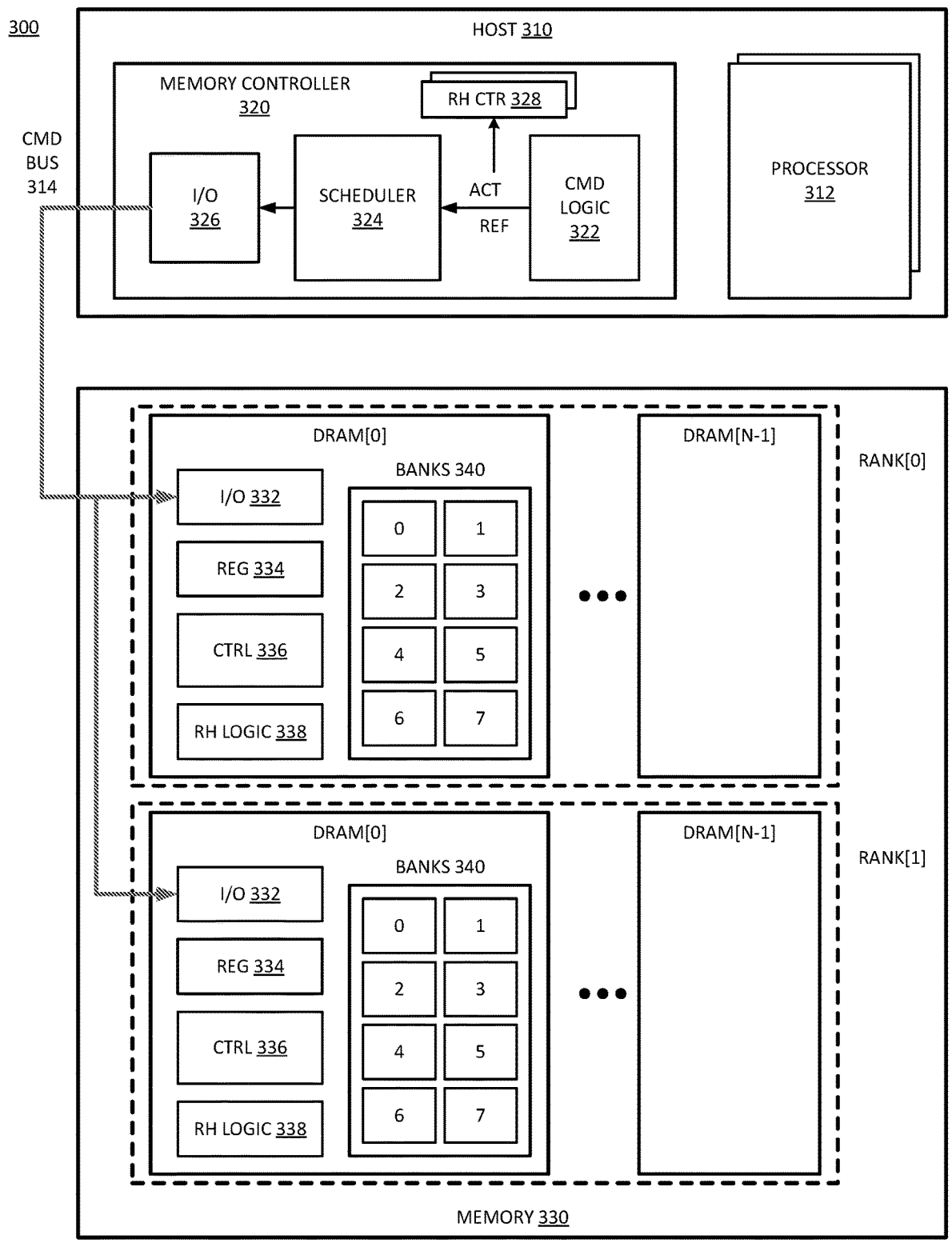
FIG. 3 is a block diagram of an example of a memory subsystem in which extra external refreshes from the host to assist in row hammer mitigation can be implemented.

FIG. 3 is a block diagram of an example of a memory subsystem in which extra external refreshes from the host to assist in row hammer mitigation can be implemented. System 300 represents elements of a computing system. System 300 provides an example of a system that can include system 100. System 300 can be considered to have a memory subsystem with memory controller 320 and memory 330. Host 310 represents the hardware platform that controls the memory subsystem. Host 310 includes one or more processors 312 (e.g., a central processing unit (CPU) or a graphics processing unit (GPU)) that generate requests for data stored in memory 330.

Host 310 includes memory controller 320, which can be integrated onto a processor device. Memory controller 320 includes I/O (input/output) 326 to connect to memory 330. I/O includes connectors, signal lines, drivers, and other hardware to interconnect the memory devices to host 310. I/O 326 can include command I/O as represented by command (CMD) bus 314, and data I/O by a DQ (data) bus (not specifically illustrated). CMD bus 314 includes command signal lines that enable memory controller 320 to send commands to memory 330, including activate commands (ACT) and refresh commands (REF).

Memory controller 320 includes command (CMD) logic 322 to generate commands for memory in response to operations by processor 312. The commands can be commands for data access (such as Read, Write, Refresh, or other commands), or commands for configuration (such as mode register commands). Memory controller 320 includes scheduler 324 to schedule when to send commands in a sequence of operations. Scheduler 324 can control the timing for I/O in accordance with known timing to improve the chance that I/O will be error free. The timing is set through training.

Memory 330 can include individual memory devices, or can represent a memory module. System 300 illustrates two ranks of memory devices in memory 330, Rank[0] and Rank[1]. A rank refers to a collection or group of memory devices that share a select line (e.g., a CS signal line). Thus, memory devices in a rank will execute operations in parallel. Rank[0] and Rank[1] are illustrated to include N DRAM devices or DRAMs. Typically, a system with multiple ranks will have the same number of DRAMs in each of the ranks.

DRAM[0] of Rank[0] and DRAM[0] of Rank[1] are shown to include I/O 332, control (CTRL) 336, and registers (REG) 334. Such components will be understood to be included in the other DRAMs as well. I/O 332 represents connection hardware comparable to I/O 326 of memory controller 320. I/O 332 enables connection of DRAMs to memory controller 320. Register 334 represents one or more registers within the DRAM, which include one or more configuration registers such as mode registers. Register 334 can store configuration information and information that determines a mode of operation by the DRAM in response to signals on command and data signal lines. In one example, the DRAMs include a register 334 to store a programmable value to indicate a row hammer mitigation threshold.

Control logic 336 represents control components within the DRAM to decode and execute the commands and access operations. Control 336 causes the DRAM to perform the internal operations needed to execute the access initiated by memory controller 320. In one example, the DRAMs include row hammer (RH) logic 338, which represents row hammer logic in accordance with what is described herein. In one example, row hammer logic 338 is part of control logic 336. Row hammer logic 338 enables the DRAMs to determine how to perform refresh to manage row hammer mitigation. For example, row hammer logic 338 can control refresh cycle stealing to perform row hammer mitigation.

In one example, memory controller 320 includes one or more how hammer counters (RH CTR) 328 to monitor a condition for row hammer mitigation. In one example, counters 328 detect a number of activate commands sent to memory 330. Tracking the commands scheduled to be sent to memory 330 can be a good indicator of when extra refreshes may be needed for row hammer mitigation.

In one example, memory controller 320 includes a number of counters 328 sufficient to provide the level of tracking granularity desired in system 300. The highest granularity is channel. System 300 does not specifically illustrate a second channel. A channel refers to all memory devices that connect to the same command bus. Command bus 314 connects to all illustrated DRAM devices, and therefore be assumed to be a single channel.

The DRAM devices are illustrated as having multiple banks (Bank[0:7]). It will be understood that eight banks is one example, and is not limiting. Other systems may include 4 banks, 16 banks, 32 banks, or some other number of banks. A binary number of banks is simpler from the perspective of addressing, but is not necessary for purposes of operation and any number of banks could be used. Banks 340 can be utilized as separate banks, separately addressable by bank number. In one example, banks 340 are organized in a bank group, such as Bank[0:3] as BG0 (bank group 0) and Bank[4:7] as BG1. The bank groups could alternatively be BG0 having Bank[0,2,4,6], for example, or some other grouping. Bank groups can typically be accessed separately, and can enable shorter access times than back to back accesses to banks of the same bank group, for example.

A lower level of granularity can be the rank level, where each rank can be tracked separately. An extra refresh command would be sent only to the rank detected to have a threshold number of activate commands. Another level of granularity can be a package or die basis for a memory device die or package. Such a level can provide balance for system 300, as the tracking by memory controller 320 would match the tracking performed by the DRAM devices. As before, the extra refreshes can be limited to being sent when needed, and only to the device(s) detected to need the extra refreshes.

A lower level of granularity (finer granularity) can be based on the granularity of the refresh commands of the particular DRAM technology of memory 330. For example, different DRAM technologies can perform refresh based on bank set, bank group, or on a per bank basis. A bank refers to a group of rows that are addressed together with row and column decoders. A bank group refers to a group of banks that can be accessed together based on a bank group decoder based on a bank group address. A bank set can refer to the identification of banks across bank groups that have a common bank address in the bank group.

The advantage of finer granularity is that the extra refresh commands would be sent only to the affected area, not the entire chip or channel. The disadvantage of finer granularity is additional tracking logic in memory controller 320, such as counters 328. Whatever level of granularity is used, the extra refresh commands are sent to only the specific segment for which the activate threshold is detected.

In the current implementation of DRAM devices that allow per bank or bank set refresh, extra refreshes to a particular bank or bank set is not normally allowed, as there is a common row counter. An implementation of the row hammer mitigation described may require an exception to the typical rule, where the DRAM could detect an additional refresh to a particular bank set or bank and use it for row hammer mitigation.

Figures 4, 5:
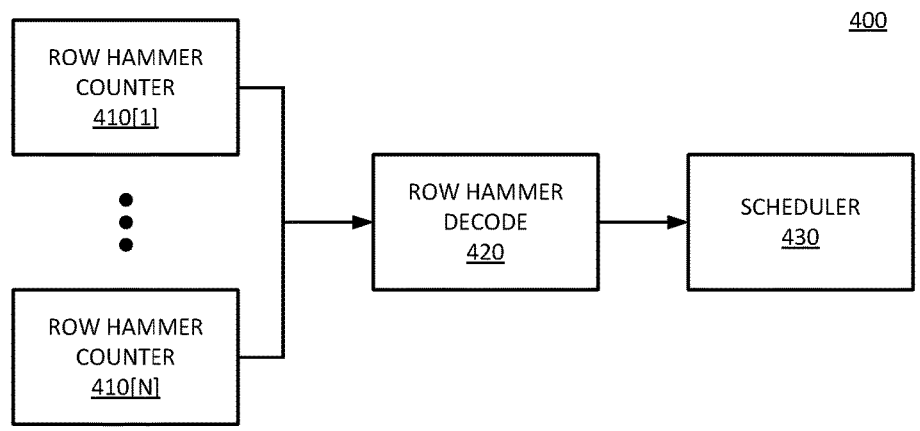
FIG. 4 is a block diagram of an example of multiple counters to track row hammer mitigation information for different memory portions.
FIG. 5 is a representation of an example of selected commands in a command truth table of a system that supports host assisted row hammer mitigation.

FIG. 4 is a block diagram of an example of multiple counters to track row hammer mitigation information for different memory portions. System 400 represents elements of a memory controller in accordance with any example herein. System 400 includes scheduler 430 to schedule and send commands to a memory device.

In one example, system 400 includes multiple row hammer counters 410. System 400 illustrates N counters, where N is a value that represents a number of elements to be tracked for row hammer conditions. For example, if the level of monitoring for row hammer mitigation happens at the level of memory device die, N can equal the number of device dies connected to the memory controller.

In one example, system 400 includes row hammer decode 420, which can determine from counters 410 which portion of the memory to send an extra refresh command. Row hammer decode 420 can ensure that scheduler 430 schedules an extra refresh for a counter that indicates a potential row hammer condition. It will be understood that the finer granularity that is tracked, the more counters 410 the memory controller will need to identify row hammer mitigation conditions.

FIG. 5 is a representation of an example of selected commands in a command truth table of a system that supports host assisted row hammer mitigation. Command table 700 illustrates an example of command encoding for a memory device that performs row hammer mitigation refresh in accordance with any description herein.

For command table 500, the command bus signals can include CS for chip select, and multiple CA (command/address) signals identified as CA[0:13]. The number of CA signal lines can be more or fewer than what is depicted. The legend for the signal line values can be as follows: BG=bank group address; BA=bank address; R=row address; C=column address; BC8=burst chop 8; MRA=mode register address; OP=opcode; CID=chip identifier; CW=control word; H=logic high; L=logic low; X=Don't Care or it does not matter what state the signal has, and the signal may be floated; and, V=valid meaning any valid signal state, or more specifically, either high or low.

ACT represents an Activate command that can be used in memory array access. As indicated above, a number of activates equal to or above a threshold can result in a row hammer event. In one example, a memory controller counts the number of activates and sends an extra refresh command to provide additional refresh cycles for the memory device to be able to perform row hammer mitigation.

Command table 500 includes a Refresh All command REF, to refresh all rows. The REF command causes the memory device to refresh rows in accordance with a row address indicated in a refresh counter. In one example, in accordance with what is described above, the memory device can refresh rows out of order from the refresh counter to perform refresh of victim rows at risk of data loss from a row hammer event. The memory device performs randomization of the selected row.

In one example, command table 500 includes a refresh same bank REFsb command to refresh the same bank in different groups. In one example, the memory device can perform row hammer mitigation refresh as stolen refresh cycles from either REF or REFsb commands. In one example, command table 500 includes a self refresh entry SRE command to cause a memory device to enter a low power state and perform self refresh. It will be understood that SRE is a separate type of command from REF or REFsb. The REF and REFsb commands can be referred to as external refresh commands.

In one example, one or more refresh commands are tagged by the memory controller to mark it as an extra refresh or a row hammer refresh command. The memory device can detect the bit and determine from it that the refresh command is intended for row hammer mitigation. In one example, the refresh command can be extended with a header or other bit to indicate the row hammer mitigation. It will be observed that for command table 500, there are bits CA8 and CA9 that only require a valid signal to comply with the command encoding, as designated by area 510. As such, these bits could be used as tags, for example, with the memory controller setting the value of one of the bits to indicate a row hammer mitigation refresh and the memory device detecting the logic value of the bit to determine whether it is a standard refresh command or a row hammer refresh command. In one example, a command modified to have information in a bit permissible but not directed under a memory device specification (e.g., such as CA8 and CA9 under double data rate (DDR) standards) can be considered a refresh management command.

It will be understood that the illustrated tagging is only one possible example. There are other ways the command can be tagged as being for row hammer mitigation.

Figure 6:
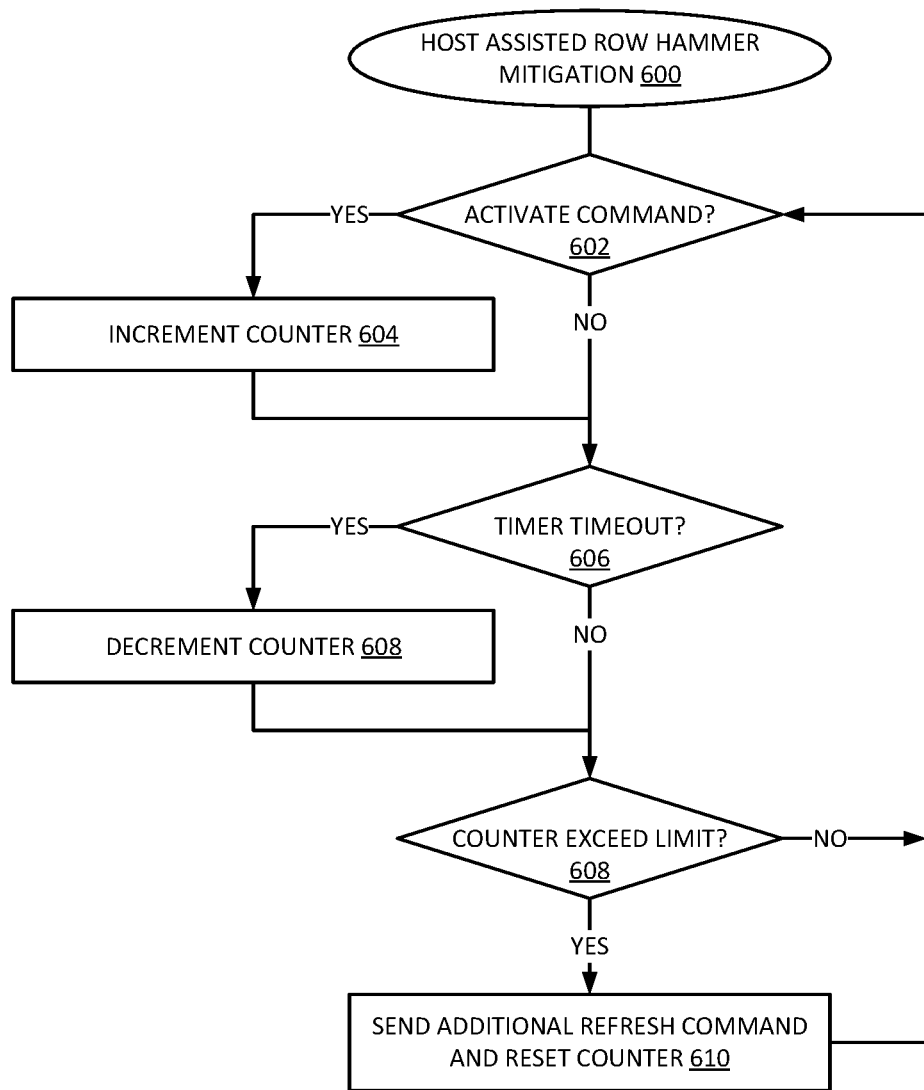
FIG. 6 is a flow diagram of an example of a process for host assisted row hammer mitigation.

FIG. 6 is a flow diagram of an example of a process for host assisted row hammer mitigation. Process 600 can be implemented by a system with host assisted row hammer mitigation in accordance with any example herein.

In one example, the memory controller determines if there is an activate command to send to the memory device, at 602. If there is an activate command, 602 YES branch, the memory controller can increment a counter, at 604. In one example, if an activate command is not detected, 602 NO branch, the memory controller does not increment the counter.

After checking for the activate command, in one example, the memory controller determines whether there is a timer timeout, at 606. In one example, if there is a timer timeout, 606 YES branch, the memory controller decrements the counter. Such an implementation can be referred to as a leaky bucket implementation to create a sliding window for checking for row hammer conditions. In a leaky bucket approach, detection of an activate command increments the counter, and a timer timeout decrements the counter. The decrement can be a single decrement, depending on the frequency of the timer timeout, or by multiple units for a slower counter. If a time timeout is not detected, 606 NO branch, the counter is not changed.

In one example, after checking for activate commands and timer timeouts, the memory controller can determine if the counter exceeds its limit, which indicates that a threshold has been reached, at 608. If the threshold is reached, in one example, the memory controller sends an additional refresh command and resets the counter, at 610. In one example, if the counter has not reached the threshold, the memory system continues to monitor for activate commands, at 602.

Figure 7:
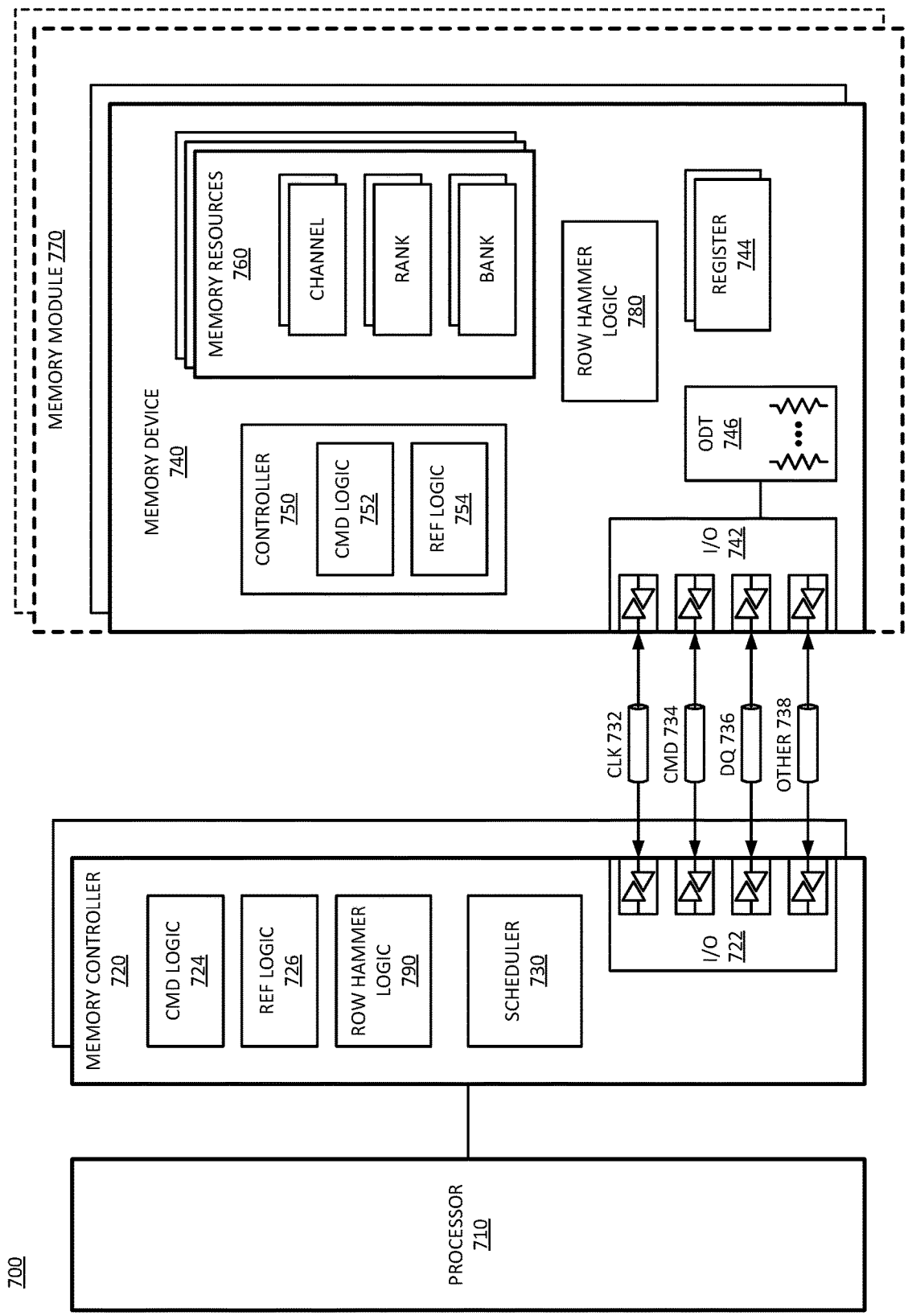
FIG. 7 is a block diagram of an example of a memory subsystem in which host assisted row hammer mitigation can be implemented.

FIG. 7 is a block diagram of an example of a memory subsystem in which host assisted row hammer mitigation can be implemented. System 700 includes a processor and elements of a memory subsystem in a computing device. System 700 can be in accordance with an example of system 100 of FIG. 1.

In one example, memory device 740 includes row hammer logic 780, which represents row hammer logic to enable the memory device to manage row hammer mitigation internally to the memory device. In one example, memory controller 720 includes row hammer logic 790 to provide for host assisted row hammer mitigation in accordance with any example provided herein. Row hammer logic 790 enables the controller to send extra refresh commands to enable memory device 740 via row hammer logic 780 to perform refresh of potential victim rows.

In one example, memory module 770 represents a DIMM, and includes a register (e.g., an RDIMM or registered DIMM). In one example, memory module 770 includes multiple buffers that are separately addressable. In an RDIMM, the register buffers the C/A bus, but the data lines can be buffered. The command bus specific PDA operation as described herein can be utilized in system 700 with or without a register or buffer or registered clock device.

Processor 710 represents a processing unit of a computing platform that may execute an operating system (OS) and applications, which can collectively be referred to as the host or the user of the memory. The OS and applications execute operations that result in memory accesses. Processor 710 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 700 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 720 represents one or more memory controller circuits or devices for system 700. Memory controller 720 represents control logic that generates memory access commands in response to the execution of operations by processor 710. Memory controller 720 accesses one or more memory devices 740. Memory devices 740 can be DRAM devices in accordance with any referred to above. In one example, memory devices 740 are organized and managed as different channels, where each channel couples to buses and signal lines that couple to multiple memory devices in parallel. Each channel is independently operable.

Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 720 manages a separate memory channel, although system 700 can be configured to have multiple channels managed by a single controller, or to have multiple controllers on a single channel. In one example, memory controller 720 is part of host processor 710, such as logic implemented on the same die or implemented in the same package space as the processor.

Memory controller 720 includes I/O interface logic 722 to couple to a memory bus, such as a memory channel as referred to above. I/O interface logic 722 (as well as I/O interface logic 742 of memory device 740) can include pins, pads, connectors, signal lines, traces, or wires, or other hardware to connect the devices, or a combination of these. I/O interface logic 722 can include a hardware interface. As illustrated, I/O interface logic 722 includes at least drivers/transceivers for signal lines. Commonly, wires within an integrated circuit interface couple with a pad, pin, or connector to interface signal lines or traces or other wires between devices. I/O interface logic 722 can include drivers, receivers, transceivers, or termination, or other circuitry or combinations of circuitry to exchange signals on the signal lines between the devices. The exchange of signals includes at least one of transmit or receive. While shown as coupling I/O 722 from memory controller 720 to I/O 742 of memory device 740, it will be understood that in an implementation of system 700 where groups of memory devices 740 are accessed in parallel, multiple memory devices can include I/O interfaces to the same interface of memory controller 720. In an implementation of system 700 including one or more memory modules 770, I/O 742 can include interface hardware of the memory module in addition to interface hardware on the memory device itself. Other memory controllers 720 will include separate interfaces to other memory devices 740.

The bus between memory controller 720 and memory devices 740 can be implemented as multiple signal lines coupling memory controller 720 to memory devices 740. The bus may typically include at least clock (CLK) 732, command/address (CMD) 734, and write data (DQ) and read data (DQ) 736, and zero or more other signal lines 738. In one example, a bus or connection between memory controller 720 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 700 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination.

It will also be understood that serial bus technologies can be used for the connection between memory controller 720 and memory devices 740. An example of a serial bus technology is 8B10B encoding and transmission of high-speed data with embedded clock over a single differential pair of signals in each direction. In one example, CMD 734 represents signal lines shared in parallel with multiple memory devices. In one example, multiple memory devices share encoding command signal lines of CMD 734, and each has a separate chip select (CS_n) signal line to select individual memory devices.

It will be understood that in the example of system 700, the bus between memory controller 720 and memory devices 740 includes a subsidiary command bus CMD 734 and a subsidiary bus to carry the write and read data, DQ 736. In one example, the data bus can include bidirectional lines for read data and for write/command data. In another example, the subsidiary bus DQ 736 can include unidirectional write signal lines for write and data from the host to memory, and can include unidirectional lines for read data from the memory to the host. In accordance with the chosen memory technology and system design, other signals 738 may accompany a bus or sub bus, such as strobe lines DQS. Based on design of system 700, or implementation if a design supports multiple implementations, the data bus can have more or less bandwidth per memory device 740. For example, the data bus can support memory devices that have either a ×32 interface, a ×16 interface, a ×8 interface, or other interface. The convention "xW," where W is an integer that refers to an interface size or width of the interface of memory device 740, which represents a number of signal lines to exchange data with memory controller 720. The interface size of the memory devices is a controlling factor on how many memory devices can be used concurrently per channel in system 700 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 740 and memory controller 720 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 740 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 740 represent memory resources for system 700. In one example, each memory device 740 is a separate memory die. In one example, each memory device 740 can interface with multiple (e.g., 2) channels per device or die. Each memory device 740 includes I/O interface logic 742, which has a bandwidth determined by the implementation of the device (e.g., ×16 or ×8 or some other interface bandwidth). I/O interface logic 742 enables the memory devices to interface with memory controller 720. I/O interface logic 742 can include a hardware interface, and can be in accordance with I/O 722 of memory controller, but at the memory device end. In one example, multiple memory devices 740 are connected in parallel to the same command and data buses. In another example, multiple memory devices 740 are connected in parallel to the same command bus, and are connected to different data buses. For example, system 700 can be configured with multiple memory devices 740 coupled in parallel, with each memory device responding to a command, and accessing memory resources 760 internal to each. For a Write operation, an individual memory device 740 can write a portion of the overall data word, and for a Read operation, an individual memory device 740 can fetch a portion of the overall data word. As non-limiting examples, a specific memory device can provide or receive, respectively, 8 bits of a 128-bit data word for a Read or Write transaction, or 8 bits or 16 bits (depending for a ×8 or a ×16 device) of a 256-bit data word. The remaining bits of the word will be provided or received by other memory devices in parallel.

In one example, memory devices 740 are disposed directly on a motherboard or host system platform (e.g., a PCB (printed circuit board) on which processor 710 is disposed) of a computing device. In one example, memory devices 740 can be organized into memory modules 770. In one example, memory modules 770 represent dual inline memory modules (DIMMs). In one example, memory modules 770 represent other organization of multiple memory devices to share at least a portion of access or control circuitry, which can be a separate circuit, a separate device, or a separate board from the host system platform. Memory modules 770 can include multiple memory devices 740, and the memory modules can include support for multiple separate channels to the included memory devices disposed on them. In another example, memory devices 740 may be incorporated into the same package as memory controller 720, such as by techniques such as multi-chip-module (MCM), package-on-package, through-silicon via (TSV), or other techniques or combinations. Similarly, in one example, multiple memory devices 740 may be incorporated into memory modules 770, which themselves may be incorporated into the same package as memory controller 720. It will be appreciated that for these and other implementations, memory controller 720 may be part of host processor 710.

Memory devices 740 each include memory resources 760. Memory resources 760 represent individual arrays of memory locations or storage locations for data. Typically, memory resources 760 are managed as rows of data, accessed via wordline (rows) and bitline (individual bits within a row) control. Memory resources 760 can be organized as separate channels, ranks, and banks of memory. Channels may refer to independent control paths to storage locations within memory devices 740. Ranks may refer to common locations across multiple memory devices (e.g., same row addresses within different devices). Banks may refer to arrays of memory locations within a memory device 740. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 740 include one or more registers 744. Register 744 represents one or more storage devices or storage locations that provide configuration or settings for the operation of the memory device. In one example, register 744 can provide a storage location for memory device 740 to store data for access by memory controller 720 as part of a control or management operation. In one example, register 744 includes one or more Mode Registers. In one example, register 744 includes one or more multipurpose registers. The configuration of locations within register 744 can configure memory device 740 to operate in different "modes," where command information can trigger different operations within memory device 740 based on the mode. Additionally or in the alternative, different modes can also trigger different operation from address information or other signal lines depending on the mode. Settings of register 744 can indicate configuration for I/O settings (e.g., timing, termination or ODT (on-die termination) 746, driver configuration, or other I/O settings).

In one example, memory device 740 includes ODT 746 as part of the interface hardware associated with I/O 742. ODT 746 can be configured as mentioned above, and provide settings for impedance to be applied to the interface to specified signal lines. In one example, ODT 746 is applied to DQ signal lines. In one example, ODT 746 is applied to command signal lines. In one example, ODT 746 is applied to address signal lines. In one example, ODT 746 can be applied to any combination of the preceding. The ODT settings can be changed based on whether a memory device is a selected target of an access operation or a non-target device. ODT 746 settings can affect the timing and reflections of signaling on the terminated lines. Careful control over ODT 746 can enable higher-speed operation with improved matching of applied impedance and loading. ODT 746 can be applied to specific signal lines of I/O interface 742, 722, and is not necessarily applied to all signal lines.

Memory device 740 includes controller 750, which represents control logic within the memory device to control internal operations within the memory device. For example, controller 750 decodes commands sent by memory controller 720 and generates internal operations to execute or satisfy the commands. Controller 750 can be referred to as an internal controller, and is separate from memory controller 720 of the host. Controller 750 can determine what mode is selected based on register 744, and configure the internal execution of operations for access to memory resources 760 or other operations based on the selected mode. Controller 750 generates control signals to control the routing of bits within memory device 740 to provide a proper interface for the selected mode and direct a command to the proper memory locations or addresses. Controller 750 includes command logic 752, which can decode command encoding received on command and address signal lines. Thus, command logic 752 can be or include a command decoder. With command logic 752, memory device can identify commands and generate internal operations to execute requested commands.

Referring again to memory controller 720, memory controller 720 includes command (CMD) logic 724, which represents logic or circuitry to generate commands to send to memory devices 740. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 740, memory controller 720 can issue commands via I/O 722 to cause memory device 740 to execute the commands. In one example, controller 750 of memory device 740 receives and decodes command and address information received via I/O 742 from memory controller 720. Based on the received command and address information, controller 750 can control the timing of operations of the logic and circuitry within memory device 740 to execute the commands. Controller 750 is responsible for compliance with standards or specifications within memory device 740, such as timing and signaling requirements. Memory controller 720 can implement compliance with standards or specifications by access scheduling and control.

Memory controller 720 includes scheduler 730, which represents logic or circuitry to generate and order transactions to send to memory device 740. From one perspective, the primary function of memory controller 720 could be said to schedule memory access and other transactions to memory device 740. Such scheduling can include generating the transactions themselves to implement the requests for data by processor 710 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 720 typically includes logic such as scheduler 730 to allow selection and ordering of transactions to improve performance of system 700. Thus, memory controller 720 can select which of the outstanding transactions should be sent to memory device 740 in which order, which is typically achieved with logic much more complex that a simple first-in first-out algorithm. Memory controller 720 manages the transmission of the transactions to memory device 740, and manages the timing associated with the transaction. In one example, transactions have deterministic timing, which can be managed by memory controller 720 and used in determining how to schedule the transactions with scheduler 730.

In one example, memory controller 720 includes refresh (REF) logic 726. Refresh logic 726 can be used for memory resources that are volatile and need to be refreshed to retain a deterministic state. In one example, refresh logic 726 indicates a location for refresh, and a type of refresh to perform. Refresh logic 726 can trigger self-refresh within memory device 740, or execute external refreshes which can be referred to as auto refresh commands) by sending refresh commands, or a combination. In one example, system 700 supports all bank refreshes as well as per bank refreshes. All bank refreshes cause the refreshing of banks within all memory devices 740 coupled in parallel. Per bank refreshes cause the refreshing of a specified bank within a specified memory device 740. In one example, controller 750 within memory device 740 includes refresh logic 754 to apply refresh within memory device 740. In one example, refresh logic 754 generates internal operations to perform refresh in accordance with an external refresh received from memory controller 720. Refresh logic 754 can determine if a refresh is directed to memory device 740, and what memory resources 760 to refresh in response to the command.

Figure 8:
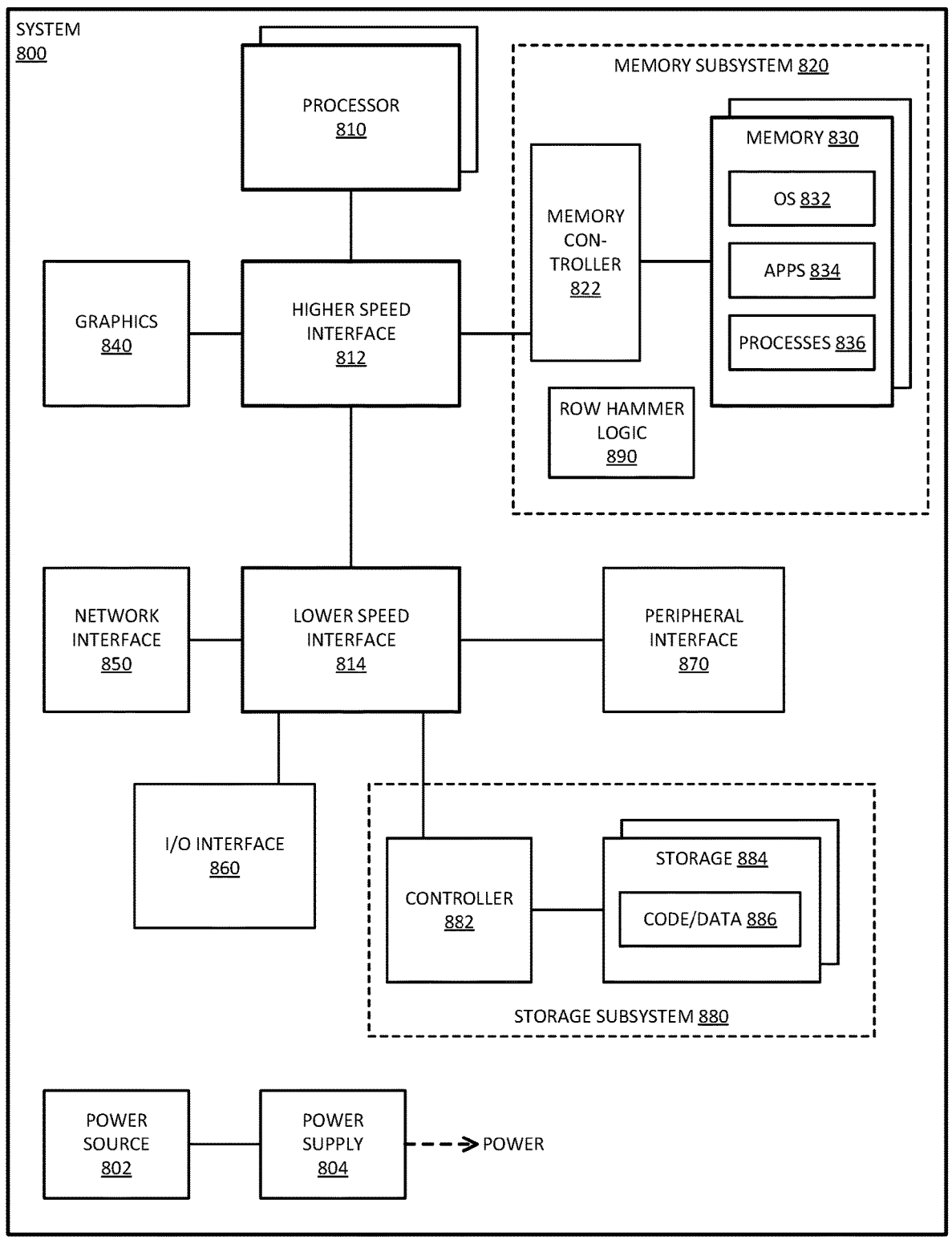
FIG. 8 is a block diagram of an example of a computing system in which host assisted row hammer mitigation can be implemented.

FIG. 8 is a block diagram of an example of a computing system in which host assisted row hammer mitigation can be implemented. System 800 represents a computing device in accordance with any example herein, and can be a laptop computer, a desktop computer, a tablet computer, a server, a gaming or entertainment control system, embedded computing device, or other electronic device. System 800 provides an example of a system in accordance with system 100.

In one example, memory subsystem 820 includes row hammer logic 890, which represents row hammer logic to enable host assisted row hammer mitigation in accordance with any example herein. The row hammer logic can include logic in the memory device to manage row hammer mitigation internally to the memory device. In one example, row hammer logic 890 includes row hammer logic in memory controller 822 to provide for host assisted row hammer mitigation in accordance with any example provided herein. Row hammer logic 890 enables the controller to send extra refresh commands to enable memory 830 to perform refresh of potential victim rows based on a number of activate commands.

System 800 includes processor 810 can include any type of microprocessor, central processing unit (CPU), graphics processing unit (GPU), processing core, or other processing hardware, or a combination, to provide processing or execution of instructions for system 800. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 800 includes interface 812 coupled to processor 810, which can represent a higher speed interface or a high throughput interface for system components that need higher bandwidth connections, such as memory subsystem 820 or graphics interface components 840. Interface 812 represents an interface circuit, which can be a standalone component or integrated onto a processor die. Interface 812 can be integrated as a circuit onto the processor die or integrated as a component on a system on a chip. Where present, graphics interface 840 interfaces to graphics components for providing a visual display to a user of system 800. Graphics interface 840 can be a standalone component or integrated onto the processor die or system on a chip. In one example, graphics interface 840 can drive a high definition (HD) display that provides an output to a user. In one example, the display can include a touchscreen display. In one example, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810, such as integrated onto the processor die or a system on a chip.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 800 includes interface 814, which can be coupled to interface 812. Interface 814 can be a lower speed interface than interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can exchange data with a remote device, which can include sending data stored in memory or receiving data to be stored in memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 800 to provide power to the components of system 800. In one example, power supply 804 includes an AC to DC (alternating current to direct current) adapter to plug into a wall outlet. Such AC power can be renewable energy (e.g., solar power) power source 802. In one example, power source 802 includes a DC power source, such as an external AC to DC converter. In one example, power source 802 or power supply 804 includes wireless charging hardware to charge via proximity to a charging field. In one example, power source 802 can include an internal battery or fuel cell source.

Figure 9:
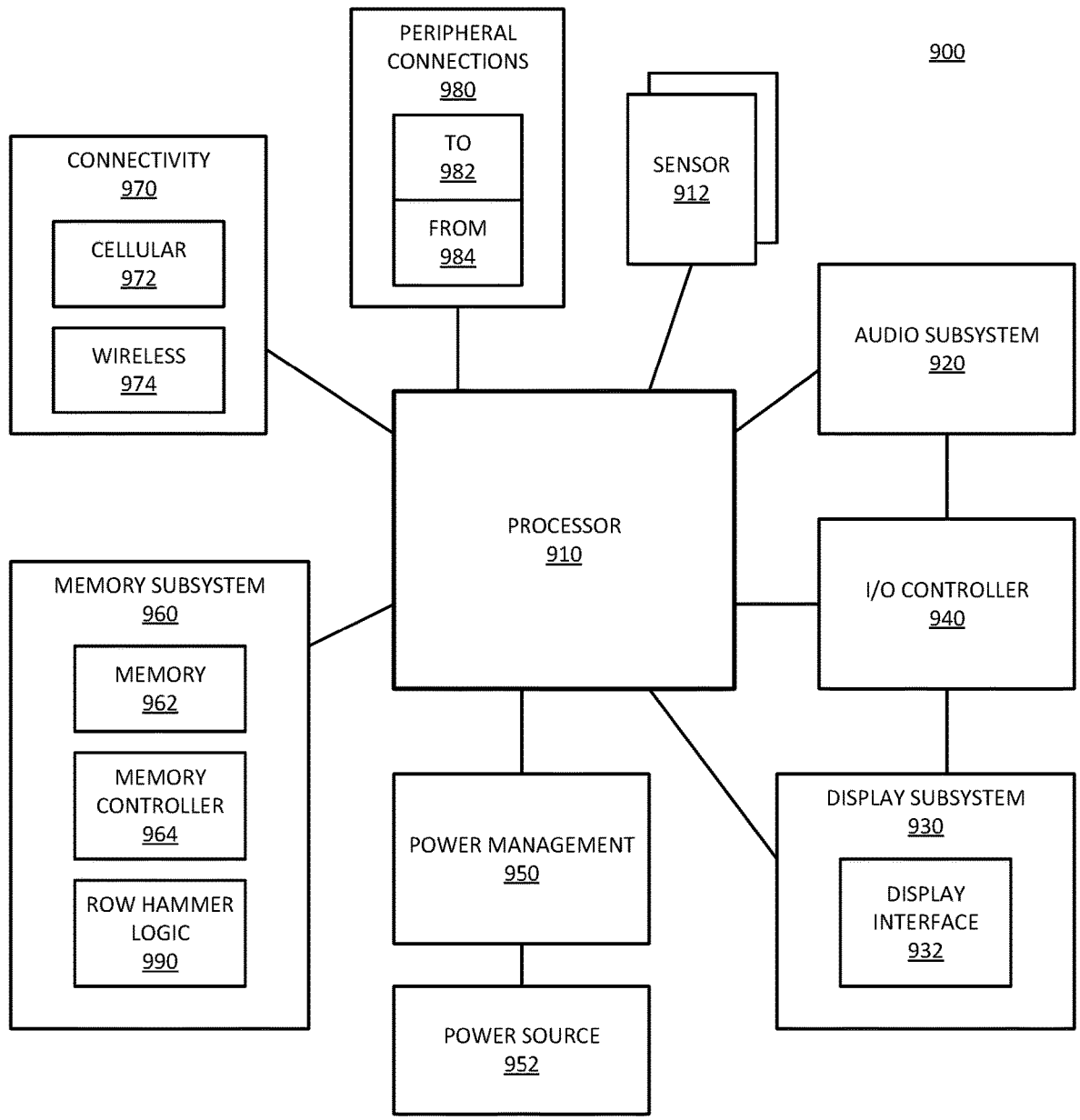
FIG. 9 is a block diagram of an example of a mobile device in which host assisted row hammer mitigation can be implemented.

FIG. 9 is a block diagram of an example of a mobile device in which host assisted row hammer mitigation can be implemented. System 900 represents a mobile computing device, such as a computing tablet, a mobile phone or smartphone, wearable computing device, or other mobile device, or an embedded computing device. It will be understood that certain of the components are shown generally, and not all components of such a device are shown in system 900. System 900 provides an example of a system in accordance with system 100.

In one example, memory subsystem 960 includes row hammer logic 990, which represents row hammer logic to enable host assisted row hammer mitigation in accordance with any example herein for any memory 962 that requires refreshing. The row hammer logic can include logic in the memory device to manage row hammer mitigation internally to the memory device. In one example, row hammer logic 990 includes row hammer logic in memory controller 964 to provide for host assisted row hammer mitigation in accordance with any example provided herein. Row hammer logic 990 enables the controller to send extra refresh commands to enable memory 962 to perform refresh of potential victim rows based on a number of activate commands.

Device 900 includes processor 910, which performs the primary processing operations of system 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting system 900 to another device, or a combination. The processing operations can also include operations related to audio I/O, display I/O, or other interfacing, or a combination. Processor 910 can execute data stored in memory. Processor 910 can write or edit data stored in memory.

In one example, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one example, one or more sensors 912 couples to processor 910 via a frontend circuit integrated with processor 910. In one example, one or more sensors 912 couples to processor 910 via another component of system 900.

In one example, system 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 900, or connected to system 900. In one example, a user interacts with system 900 by providing audio commands that are received and processed by processor 910.

Display subsystem 930 represents hardware (e.g., display devices) and software components (e.g., drivers) that provide a visual display for presentation to a user. In one example, the display includes tactile components or touchscreen elements for a user to interact with the computing device. Display subsystem 930 includes display interface 932, which includes the particular screen or hardware device used to provide a display to a user. In one example, display interface 932 includes logic separate from processor 910 (such as a graphics processor) to perform at least some processing related to the display. In one example, display subsystem 930 includes a touchscreen device that provides both output and input to a user. In one example, display subsystem 930 includes a high definition (HD) or ultra-high definition (UHD) display that provides an output to a user. In one example, display subsystem includes or drives a touchscreen display. In one example, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to system 900 through which a user might interact with the system. For example, devices that can be attached to system 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of system 900. Additionally, audio output can be provided instead of or in addition to display output. In another example, if display subsystem includes a touchscreen, the display device also acts as an input device, which can be at least partially managed by I/O controller 940. There can also be additional buttons or switches on system 900 to provide I/O functions managed by I/O controller 940.

In one example, I/O controller 940 manages devices such as accelerometers, cameras, light sensors or other environmental sensors, gyroscopes, global positioning system (GPS), or other hardware that can be included in system 900, or sensors 912. The input can be part of direct user interaction, as well as providing environmental input to the system to influence its operations (such as filtering for noise, adjusting displays for brightness detection, applying a flash for a camera, or other features).

In one example, system 900 includes power management 950 that manages battery power usage, charging of the battery, and features related to power saving operation. Power management 950 manages power from power source 952, which provides power to the components of system 900. In one example, power source 952 includes an AC to DC (alternating current to direct current) adapter to plug into a wall outlet. Such AC power can be renewable energy (e.g., solar power, motion based power). In one example, power source 952 includes only DC power, which can be provided by a DC power source, such as an external AC to DC converter. In one example, power source 952 includes wireless charging hardware to charge via proximity to a charging field. In one example, power source 952 can include an internal battery or fuel cell source.

Memory subsystem 960 includes memory device(s) 962 for storing information in system 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one example, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable system 900 to communicate with external devices. The external device could be separate devices, such as other computing devices, wireless access points or base stations, as well as peripherals such as headsets, printers, or other devices. In one example, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, system 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that system 900 could both be a peripheral device ("to" 982) to other computing devices, as well as have peripheral devices ("from" 984) connected to it. Device 900 commonly has a "docking" connector to connect to other computing devices for purposes such as managing (e.g., downloading, uploading, changing, synchronizing) content on system 900. Additionally, a docking connector can allow system 900 to connect to certain peripherals that allow system 900 to control content output, for example, to audiovisual or other systems.

In addition to a proprietary docking connector or other proprietary connection hardware, system 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a dynamic random access memory (DRAM) device includes: a memory array having multiple rows of memory; and input/output (I/O) hardware to receive commands from an associated memory controller, including multiple activate commands and multiple refresh commands, wherein in response to receipt of a threshold number of activate commands, the memory controller is to send an excess refresh command in excess of a number of refresh commands necessary to refresh the rows within a refresh window, wherein the DRAM device is to perform row hammer refresh in response to the excess refresh command to refresh potential victim rows of a potential aggressor row.

In one example, receipt of the threshold number of activates comprises receipt of the threshold number of activates within a specific time window. In one example, receipt of the threshold number of activates within the specific time window comprises a sliding window, where each activate command increases a count and an amount of time decreases the count. In one example, the threshold number of activate commands comprises a threshold number of activate commands per channel or per rank. In one example, the threshold number of activate commands comprises a threshold number of activate commands per bank or per bank group. In one example, the excess refresh command comprises a refresh command with a tag to indicate that it is for row hammer refresh.

In general with respect to the descriptions herein, in one example, a memory controller includes: a buffer to queue commands to send to a memory device having multiple rows of memory; a counter to track a number of activate commands to the memory device; and input/output (I/O) hardware to send the commands to the memory device, including multiple activate commands and multiple refresh commands, wherein in response to detection of a threshold number of activate commands, the I/O hardware is to send an excess refresh command in excess of a number of refresh commands necessary to refresh the rows within a refresh window, the excess refresh command to trigger the memory device to perform row hammer refresh to refresh potential victim rows of a potential aggressor row.

In one example, detection of the threshold number of activates comprises detection the threshold number of activates within a specific time window. In one example, detection of the threshold number of activates within the specific time window comprises a sliding window, where each activate command increases the counter and an amount of time decreases the counter. In one example, the threshold number of activate commands comprises a threshold number of activate commands per channel or per rank of multiple memory devices including the memory device. In one example, the threshold number of activate commands comprises a threshold number of activate commands per bank or per bank group of the memory device. In one example, the excess refresh command comprises a refresh command with a tag to indicate that it is for row hammer refresh.

In general with respect to the descriptions herein, in one example, a system includes: multiple dynamic random access memory (DRAM) devices having multiple rows of memory; a memory controller coupled to the multiple DRAM devices, the memory controller including a counter to track a number of activate commands to the memory devices; and input/output (I/O) hardware to send multiple commands to the memory devices, including multiple activate commands and multiple refresh commands, wherein in response to detection of a threshold number of activate commands, the I/O hardware is to send an excess refresh command in excess of a number of refresh commands necessary to refresh the rows within a refresh window, the excess refresh command to trigger a DRAM device to perform row hammer refresh to refresh potential victim rows of a potential aggressor row.

In one example, detection of the threshold number of activates comprises detection of the threshold number of activates within a specific time window. In one example, detection of the threshold number of activates within the specific time window comprises a sliding window, where each activate command increases the counter and an amount of time decreases the counter. In one example, the threshold number of activate commands comprises a threshold number of activate commands per channel or per rank of DRAM devices. In one example, the threshold number of activate commands comprises a threshold number of activate commands per DRAM device. In one example, the threshold number of activate commands comprises a threshold number of activate commands per bank or per bank group of a specific DRAM device. In one example, the excess refresh command comprises a refresh command with a tag to indicate that it is for row hammer refresh. In one example, the system includes one or more of: a host processor device coupled to the memory controller; a display communicatively coupled to a host processor; a network interface communicatively coupled to a host processor; or a battery to power the system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, or other form), such as recordable/non-recordable media (e.g., read only memory (ROM), random access memory (RAM), magnetic disk storage media, optical storage media, flash memory devices, or other media). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), embedded controllers, hardwired circuitry, or other hardware).

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device, comprising:
   a memory array having multiple rows of memory including a target row;
   a counter to track a number of activate commands received for the target row; and
   input/output (I/O) hardware to receive an excess refresh command in response to receipt of a threshold number of activate commands for the target row, the excess refresh command to be in excess of a number of refresh commands necessary to refresh the multiple rows within a refresh window, the excess refresh command to indicate a refresh operation without indication of a row address for the refresh operation, wherein the DRAM device is to perform refresh of a victim row in response to the excess refresh command, the victim row subject to row disturb based on access to the target row, wherein the DRAM device is to determine the row address for the refresh operation.

2. The DRAM device of claim 1, wherein receipt of the threshold number of activates comprises receipt of the threshold number of activates within a specific time window.

3. The DRAM device of claim 2, wherein receipt of the threshold number of activates within the specific time window comprises a sliding window, where each activate command increases a count and an amount of time decreases the count.

4. The DRAM device of claim 1, wherein the excess refresh command comprises a refresh command with a tag to indicate that it is for row hammer refresh.

5. The DRAM device of claim 4, wherein the tag comprises an unused bit of a refresh command encoding.

6. The DRAM device of claim 1, wherein the threshold number of activate commands is a number lower than a number of activates expected to trigger the row disturb.

7. The DRAM device of claim 1, wherein the counter comprises a first counter, and further comprising:
    other counters to track activate commands for other rows of the memory array.

8. The DRAM device of claim 1, further comprising:
    a comparator to compare a current activate command count to the threshold.

9. A system, comprising:
    a memory controller; and
    a dynamic random access memory (DRAM) device coupled to the memory controller, the DRAM device including:
        a memory array having multiple rows of memory including a target row;
        a counter to track a number of activate commands received for the target row; and
        input/output (I/O) hardware to receive an excess refresh command from the memory controller in response to receipt of a threshold number of activate commands for the target row, the excess refresh command to be in excess of a number of refresh commands necessary to refresh the multiple rows within a refresh window, the excess refresh command to indicate a refresh operation without indication of a row address for the refresh operation, wherein the DRAM device is to perform refresh of a victim row in response to the excess refresh command, the victim row subject to row disturb based on access to the target row, wherein the DRAM device is to determine the row address for the refresh operation.

10. The system of claim 9, wherein receipt of the threshold number of activates comprises receipt of the threshold number of activates within a specific time window.

11. The system of claim 10, wherein receipt of the threshold number of activates within the specific time window comprises a sliding window, where each activate command increases a count and an amount of time decreases the count.

12. The system of claim 9, wherein the excess refresh command comprises a refresh command with a tag to indicate that it is for row hammer refresh.

13. The system of claim 12, wherein the tag comprises an unused bit of a refresh command encoding.

14. The system of claim 9, wherein the threshold number of activate commands is a number lower than a number of activates expected to trigger the row disturb.

15. The system of claim 9, wherein the counter comprises a first counter, and further comprising:
    other counters to track activate commands for other rows of the memory array.

16. The system of claim 9, the DRAM device further comprising:
    a comparator to compare a current activate command count to the threshold.

17. The system of claim 9, further comprising one or more of:
    a host processor device coupled to the memory controller;
    a display communicatively coupled to a host processor;
    a network interface communicatively coupled to a host processor; or
    a battery to power the system.

18. A method comprising:
    tracking a number of activate commands received for a target row of multiple rows of a memory array of a memory device;
    receiving an excess refresh command in response to receipt of a threshold number of activate commands for the target row, the excess refresh command to be in excess of a number of refresh commands necessary to refresh the multiple rows within a refresh window, the excess refresh command indicating a refresh operation without indication of a row address for the refresh operation;
    performing refresh of a victim row in response to the excess refresh command, the victim row subject to row disturb based on access to the target row, wherein the memory device is to determine the row address for the refresh operation.

19. The method of claim 18, wherein the excess refresh command comprises a refresh command with a tag indicating that it is for row hammer refresh.

20. The method of claim 18, wherein tracking the number of active commands comprises tracking activate command for multiple rows of the memory array.

* * * * *